(12) United States Patent
Thodesen et al.

(10) Patent No.: US 6,343,211 B1
(45) Date of Patent: Jan. 29, 2002

(54) LO CANCELLING MIXER

(75) Inventors: Yngve Thodesen, Rädal; Ove Laurhammer, Sandsli, both of (NO)

(73) Assignee: Nera Asa, Kokstad (NO)

( * ) Notice: Subject to any disclaimer, the term of this patent is extended or adjusted under 35 U.S.C. 154(b) by 0 days.

(21) Appl. No.: 09/218,880

(22) Filed: Dec. 22, 1998

(30) Foreign Application Priority Data

Dec. 23, 1997 (NO) .................................................. 976054
Feb. 2, 1998 (NO) .................................................. 980433

(51) Int. Cl.[7] .................................................. H04B 1/10
(52) U.S. Cl. ...................... 455/317; 455/305; 455/310; 455/326
(58) Field of Search .................... 455/302–305, 455/118, 124, 313, 317–319, 326, 310; 327/113, 119, 355, 356, 430, 431; 331/108 R; 332/123

(56) References Cited

U.S. PATENT DOCUMENTS

| | | | | |
|---|---|---|---|---|
| 5,012,208 A | * | 4/1991 | Makinen et al. | .......... 455/63 X |
| 5,303,418 A | * | 4/1994 | Staudinger et al. | ......... 455/326 |
| 5,355,533 A | * | 10/1994 | Dickerson | .................... 455/306 |
| 5,410,743 A | * | 4/1995 | Seely et al. | .................. 455/326 |
| 5,789,963 A | * | 8/1998 | Sakusabe | .................... 327/356 |
| 5,809,409 A | * | 9/1998 | Itoh et al. | .................... 455/327 |
| 5,963,858 A | * | 10/1999 | Seely | .......................... 455/326 |
| 6,029,059 A | * | 2/2000 | Bojer | .......................... 455/326 |

* cited by examiner

*Primary Examiner*—Nay Maung
(74) *Attorney, Agent, or Firm*—Fulbright & Jaworski LLP

(57) ABSTRACT

There is described a system and a process for reducing leakage of LO (LLO) in a system which converts the frequency of a first signal by mixing the first signal with a second supplied signal to a third signal having a frequency which is different from the frequency for the first and second signal, where the first signal is divided via a number of couplers into four part-signals which are phase-shifted relative to each other, and that each such part-signal is led through its respective transistor there being added via each transistor a second signal which is mixed with the first signal, and that the signals which pass through the transistors are modulated by a number of regulating means for each transistor, preferably one or two per transistor, and that the frequency-shifted part-signals are added to a third signal via a number of couplings after having been phase-shifted, the voltage regulators being adjustable so that the signals are modulated and LLO is reduced.

16 Claims, 12 Drawing Sheets

LO CANCELLING MIXER

BACKGROUND OF THE INVENTION

1. Field of the Invention

The present invention relates to a process and a system for reducing leakage of LO (LLO) in a system which converts the frequency of a first signal by mixing the first signal with a second supplied signal to a third signal of a frequency which is different from the frequency for the first and second signal. More specifically the invention relates to a process and a system which removes LLO in non-ideally balanced transistor mixers.

2. Description of the Related Art

In modern radio communication there is used a conversion from a carrier wave frequency to a second. For this conversion a frequency converter/mixer is employed. Ideally this mixer functions so that it receives the signal which is to be converted—IF—and a local oscillator signal—LO— and emits only one signal—RF—which has a frequency equal to the sum or the difference of the frequencies for IF and LO. Practical limitations cause several other undesired signals also to be present together with RF. A so-called "image"—IM—will be present (both "the sum signal" and "the difference signal" will come to the RF-gate—the one is desired, while the other is IM and consequently undesired). LO will leak out. In addition a series of other undesired signals will arise in the mixer. These can be made small and insignificant by employing as far as possible a linear mixing element and by allowing LO to be strong and dominating relative to IF and RF. The level of leaked LO—LLO—is proportional to the level of the supplied LO—TLO. The two dominating undesired signals will therefore be IM and LLO.

There are described some solutions for reducing LLO. FIG. 2a shows a balanced solution according to the state of the art which is employed for attenuating LLO. There are employed two equal mixing elements which are supplied each with its half of LO and IF. The halves must be in counter-phase. At the end that which comes out from the two mixing elements is added up. RF and IM will be added separately in phase, while LLO will be added in counter-phase and be phased out. Practical limitations in the components will however limit the effect of the phasing out so that LLO becomes more than 1 per thousand of LO (−30 dB). For example the coupler will in practice deviate and will not be exactly equal to 180 degrees (often in a region from 175–185), and the phase path in the transistors is often also somewhat different (deviation of up to 5 degrees). The requirement is often that LLO shall be less than 0.01 per thousand (−50 dB). The solution according to the state of the art is therefore not satisfactory.

A more general way to realise a balanced mixer is by allowing the coupler at the input to produce a phase difference of AB1 (0 to 180 degrees) and to replace the adding coupler at the output with a coupler which produces a phase difference of AB2 (180 degrees–AB1).

Furthermore it is known that IM can be attenuated by employing a so-called "image reject" solution (see FIG. 1b). That is to say to employ two equal mixers (prefereably, each of the mixers can generally be balanced mixers) which are supplied each with its half of LO and IF. The halves must be 90° out of phase. At the output RF is added in phase, and IM in counter-phase. In this system however LLO is added 90° out of phase and is little reduced. A more general way to realise an image reject mixer is by allowing the coupler at the input to produce a phase difference of AQ1 (0 to 90°) and to replace the adding coupler at the output with a coupler which produces a phase difference of AQ2 (90 degrees–AQ1).

On the basis of the conditions indicated, one of the main problems with mixers is therefore that a compromise must be made between the following requirements:

1. The mixers must as far as possible be clean/linear in the conversion. This implies a strong TLO.
2. The mixers must not have too high LLO. This involves a weaker TLO.

This relation is outlined in FIG. 1b. The distance "3" in FIG. 1b is usually critical in a mixer, that is to say the relationship between the RF-signal and LLO. This relationship can be increased in two ways; (a) in that "1" in FIG. 1b is reduced, for example by phasing out as shown in FIG. 3 or by other LLO—reducing methods, or by (b) increasing "2" which can be achieved by increasing TIF (supplied IF) so that RF increases, but this requires that a more linear element is employed. The transistor is generally more linear than the diode, particularly when it operates in the passive mode. With a passive mode mixer "2" it is possible to raise "2" in FIG. 1b considerably.

In order to obtain a satisfactory solution there will be a need for a mixer element which is as far as possible linear. Thus less LO will be required in order to manage the same linearity. Simultaneously there is a need for developing better methods than those which are known within the state of the art for reducing LLO.

The mixer element which has been most usually employed up to to-day is a Schottky—diode. An example of the removal of LLO is present in a diode mixer ( Wolfgang Schiller, "Broadband Linear SSB Upconverter with Electronically Controlled LO Suppression for 16–QAM Applications at 4 GHz ", 13th EuMC, pp. 585–589, September 1983).

Publications do not show clearly how the circuit operates, but it appears as if the diode mixer in Schiller's article employs an adjustment of the reflection in order to reducing the LLO.

The use of transistors in mixers has however many clear advantages compared with the use of diodes, such as improved linearity, lower costs for production, mounting and the like and increased working life. For a comparison of advantages and disadvantages with diodes relative to transistors reference is made to M. J. et al.: "A Comparison of GaAs Transistors as Passive Mode Mixers", 1994 IEEE MTT-S Digest, pp 937–940 and Stephen A. Maas, "Microwave Mixers—Second Edition", Artech House, 1993, page 313.

The use of transistors as mixing elements is therefore increasing. It is therefore crucial to develop a good method for removing LLO in mixers which employ transistors.

The element which to-day is considered to be the most linear is a transistor in so-called passive mode, that is to say without supply voltage, that is to say with only biasing (voltage signal) at the input (the Gate). This is so far tested on three transistors; MOSFET, MESFET and HEMT.

The methods which exist for reducing LLO in mixers which employ transistors are few. The most obvious method is filtering. But if IF has low frequency relative to LO and RF, the filtering will often not be practically realisable.

An alternative aproach is described in U.S. Pat. No. 4,355,420 (Ishihara), and is a so-called phasing out method (see FIG. 3). A small portion of TLO is decoupled before the rest is supplied to a mixer (this can well be both balanced and image reject). The portion which is dicoupled is adjusted in amplitude and phase before it is supplied at the output after the mixer. By correct adjustment the adjusted LO portion (JLO) will have the same level as LLO, but be in counter-phase and thus phase out LLO. This method ensures at LLO is sufficiently low if the correct amplitude and phase are adjusted in. However the method is dependent on a so-called phase shifter which will be able to adjust JLO in phase and amplitude. This increases the price of and complicates the mixer. Further this method involves a loss of TLO in first coupler and loss of RF in last coupler. Both leading to increased loss in the mixer and the linearity suffers. Furthermore it is a fact that the elements which determine level and amplitude of LLO and JLO are vastly different, and they will consequently vary differently with respect to temperature. Thus the phasing out or the LO-cancellation will be very sensitive to swings in temperature. In worst cases the method will lead to increased LLO, if JLO is added in close phase.

These limitations of known solutions and systems aim to be minimised by providing a system and a process where transistors are utilised in mixers, and where these are arranged so that LLO is reduced considerably. The system and the process according to the present invention can thus be employed where limitations in the components produce non-ideal conditions.

SUMMARY OF THE INVENTION

The process according to the present invention is characterised in that:

- the first signal is divided via a number of couplers into a number of part-signals, preferably 4, which are phase-shifted relative to each other, and
- that each such part-signal is led through its respective transistor there being added a second signal via each of the transistors which is mixed with the first signal, and also
- the signals which pass through the transistors are modulated with a number of voltage regulating arrangements for each transistor, preferably one or two per transistor, and that the frequency-shifted part-signals are added to a third signal via a number of couplers after the signals are phase-shifted relative to each other, the voltage regulating arrangements being set to modulate the signals to that LLO is reduced.

The present invention also relates to a system which is characterised in that it comprises a coupler, two transistor mixer and an adding circuit, in which each of the mixers comprises a coupler, two transistors and a coupler, each of the transistors comprising a number of regulating means for modulating the signals which are led through the transistors, such as by voltage regulation (indicated as $V_1$–$V_4$ for passive mode and $V_1$–$V_8$ for active mode), and means for supplying a second signal to the first signal.

BRIEF DESCRIPTION OF THE DRAWINGS

The invention will now be further explained with reference to the accompanying Figures and claims, wherein:

DETAILED DESCRIPTION OF THE INVENTION

Figure 1A:
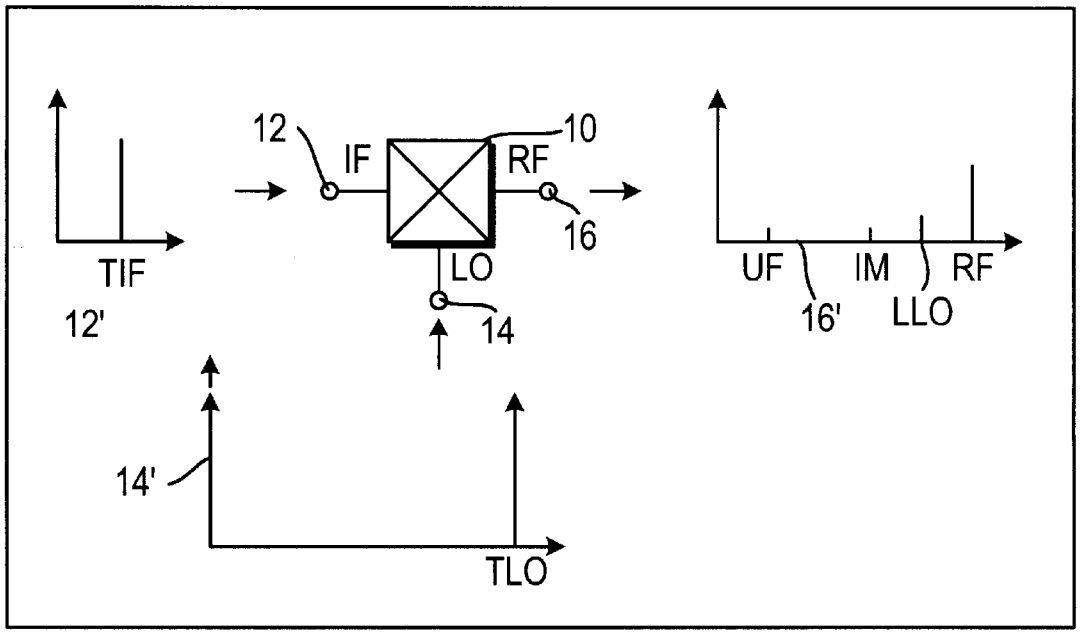
FIG 1a shows how IF and LO are mixed in a mixer to form an RF-signal.

In the FIGS. 1–7 the coupling points (terminals) are indicated as —0—. In order to obtain the Figures surveyable as far as possible we have however chosen not to insert reference numerals at all these coupling points.

The following abbreviations are employed:

IF Intermediate frequency ('intermediate frequency')

| | |
|---|---|
| TIF | Supplied IF |
| LIF | Leaked IF |
| RF | Radio frequency |
| LO | Local oscillator |
| TLO | Supplied LO |
| LLO | Leaked LO |
| JLO | Adjusted LO |

As mentioned FIG. 1 is included so as to illustrate the relationship between the RF-signal and LLO. FIG. 1a shows a mixer 10, and the signals which are transmitted into the mixer, i.e. an IF-signal via a terminal 12 and an LO-signal via a terminal 14, and the RF-signal which comes out of terminal 16 of mixer 10. Further the various signals are illustrated each in its axis system, 12', 14', 16' respectively, wherein the y-axis indicates the amplitude of the signal and the x-axis indicates the frequency of the signal.

Figure 1B:
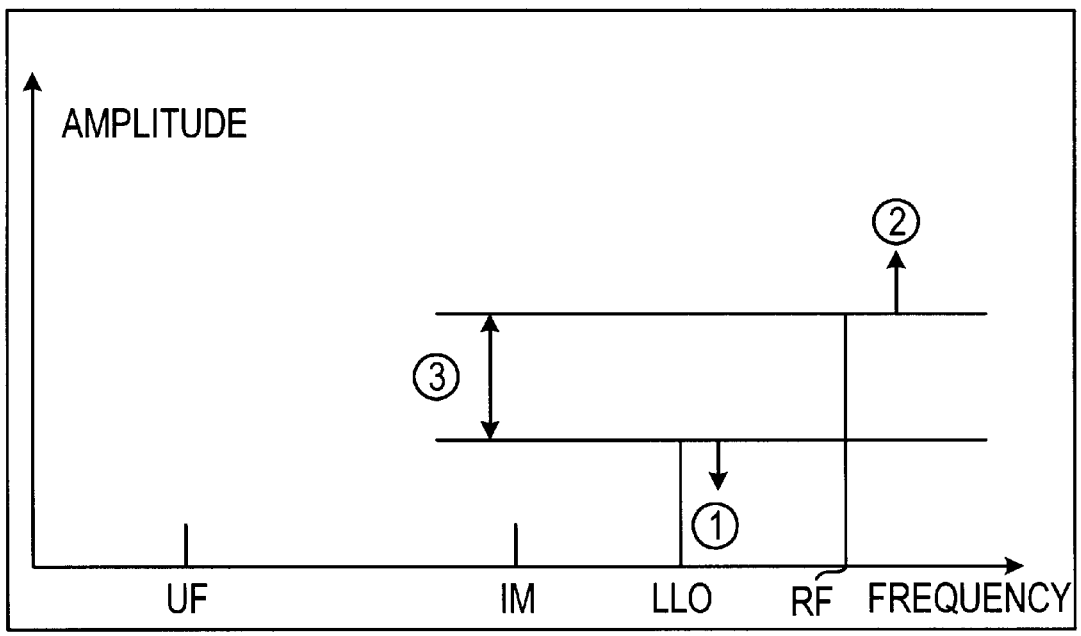
FIG. 1b shows which factors which influence the relationship between RF and LLO.

FIG. 1b shows which factors, here indicated as "1", "2" and "3", which influence the relationship between RF and LLO. As mentioned it is desired that "3" shall be as large as possible.

Figure 2A:
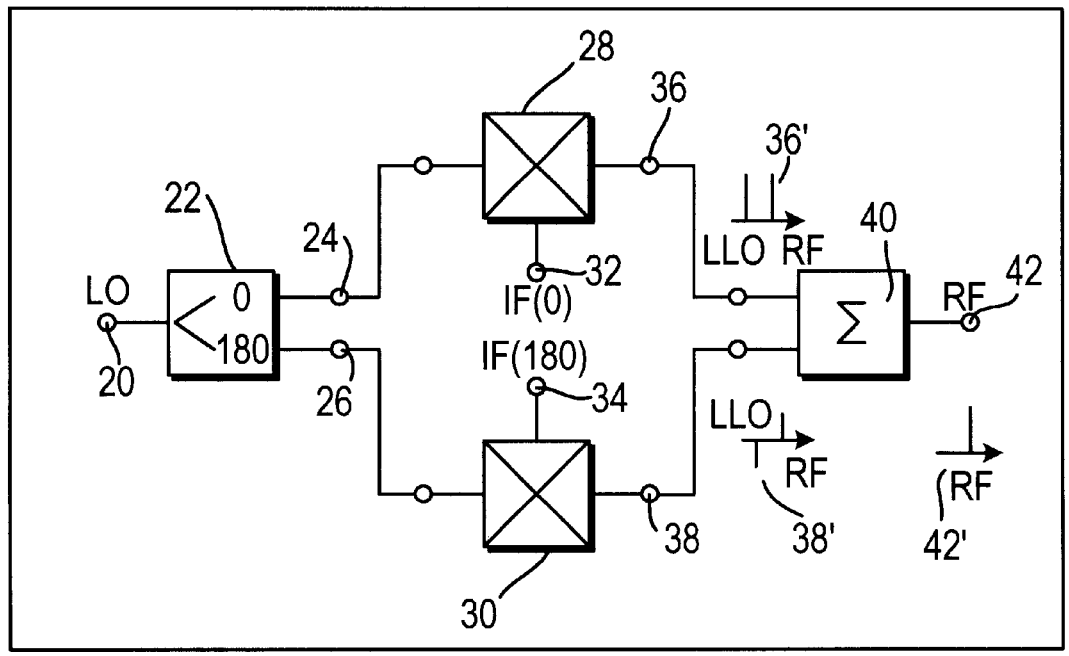
FIG. 2a shows a balanced solution in accordance with the state of the art which is utilised for reducing LLO.

FIG. 2a shows a balanced solution in accordance with the prior art which is utilised for reducing LLO. It is shown that the LO-signal is supplied via a terminal 20 to a coupler 22, and is divided into two portions. The two portions are phase-shifted 180° relative to each other, i.e. in counter-phase, and are led out of the coupler 22 via the terminals 24,26 and into two mixers, 28,30 respectively where they are mixed each with its IF-signal, led in via the terminals 32,34, respectively. The IF-signals are also in counter-phase. From the two mixers 28,30 the signals are led respectively via the terminals 36,38 to a adding circuit 40 where the signals are added to an RF-signal which leaves the adding circuit 40 through the terminal 42. In the Figure the signals are illustrated (as 36', 38' and 42') so as to show how LLO is phased out while the RF-signal is added.

Figure 2B:
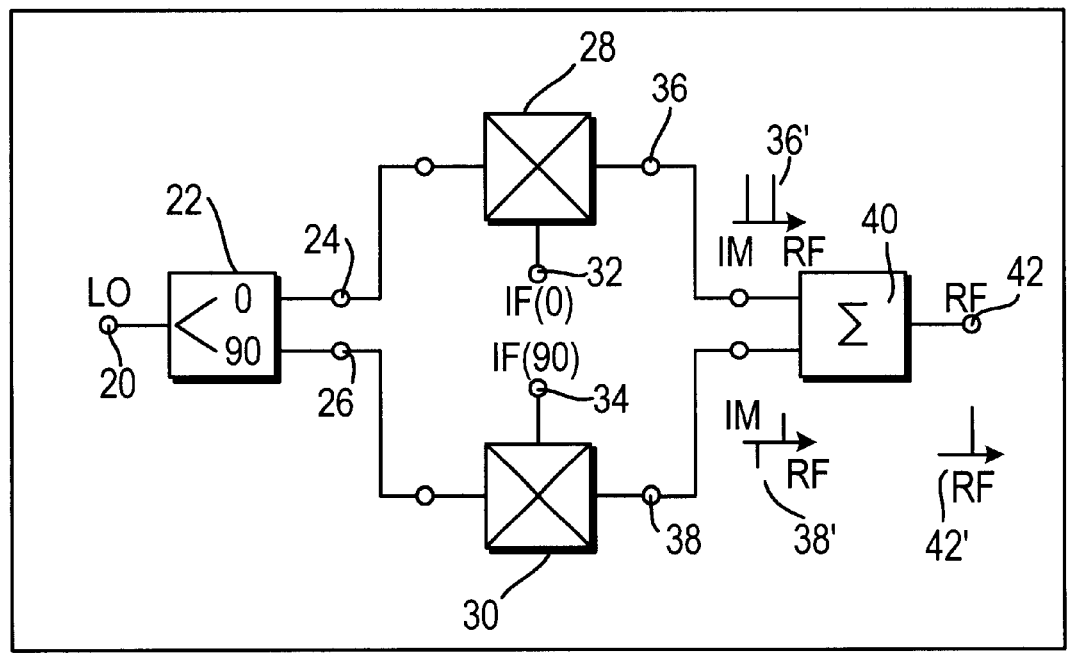
FIG. 2b shows a balanced system according to the state of the art which is utilised for reducing IM.

FIG. 2b is equivalent to FIG. 2a, but is adapted for removing the IM-signal (LLO is little removed). TLO is divided into two portions in the coupler 22 and the portions are phase-shifted 90°. Further the IF-signals which are supplied to the mixers 28,30 are also phase-shifted 90° This phases out the IM-signal by the summation which takes place in the adding circuit 40, as illustrated by 36', 38' and 42'.

Figure 3:
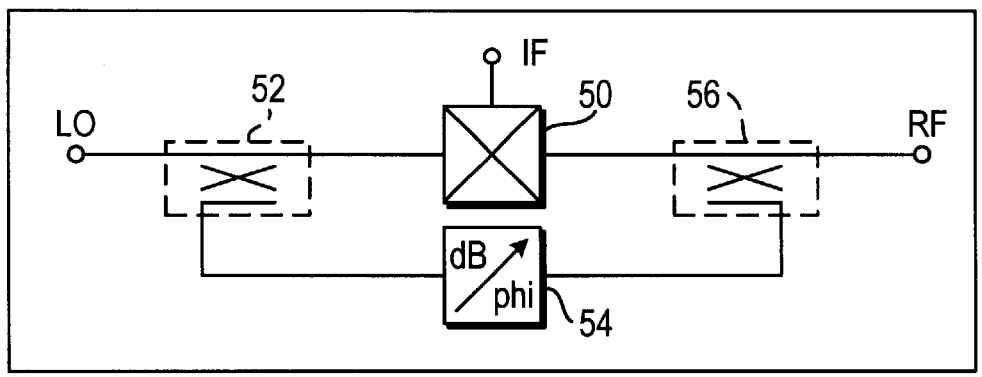
FIG. 3 shows a phasing out method according to the state of the art which is utilised for reducing LLO.

FIG. 3 shows a phasing out process according to the prior art (Ishihara). An LO-signal and an IF-signal are mixed in the mixer 50. A little of the LO-signal is diverted into a branch circuit 52 before the remainder is fed to the mixer 50. The portion of the signal which passes outside the mixer 50 is adjusted in phase and amplitude in a phase-/amplitude circuit 54 before the remainder is fed back via a coupling 56.

FIG. 4 shows a balanced transistor mixer. This is the starting point of the system and the method according to the present invention. The transistor can be of the bipolar type, such as conventional bipolar or HBT, or FET, such as MESFET or HEMT. The transistors can be operated in two modes: active mode and passive mode. FIG. 4 shows a balanced transistor mixer in a passive mode. The LO-signal which is fed to the coupler 60 is divided in two with a phase shift of AB1 (0 to 180 degrees). The one signal is led out through terminal 62 and is mixed in a transistor with a signal $V_1$ which is supplied through a low pass filter 66 and an IF-signal fed through a low pass filter 68. The other portion of the LO-signal which leaves the coupling 60 through the terminal 64 is mixed in a transistor with a signal $V_2$ supplied via low pass filter 70 and an IF-signal supplied via low pass filter 72. The signals which come from the two transistors are added in a coupling 74 with a phase shift of AB2 (most preferred to be 180°–AB1), to an RF-signal which leaves the coupler 74 in terminal 76. $V_1$ and $V_2$ cannot pass through the coupler 60. IF cannot pass through the coupler 74. The IF-signals which are supplied to the two transistors are phase-shifted 180° relative to each other.

Figure 4A:
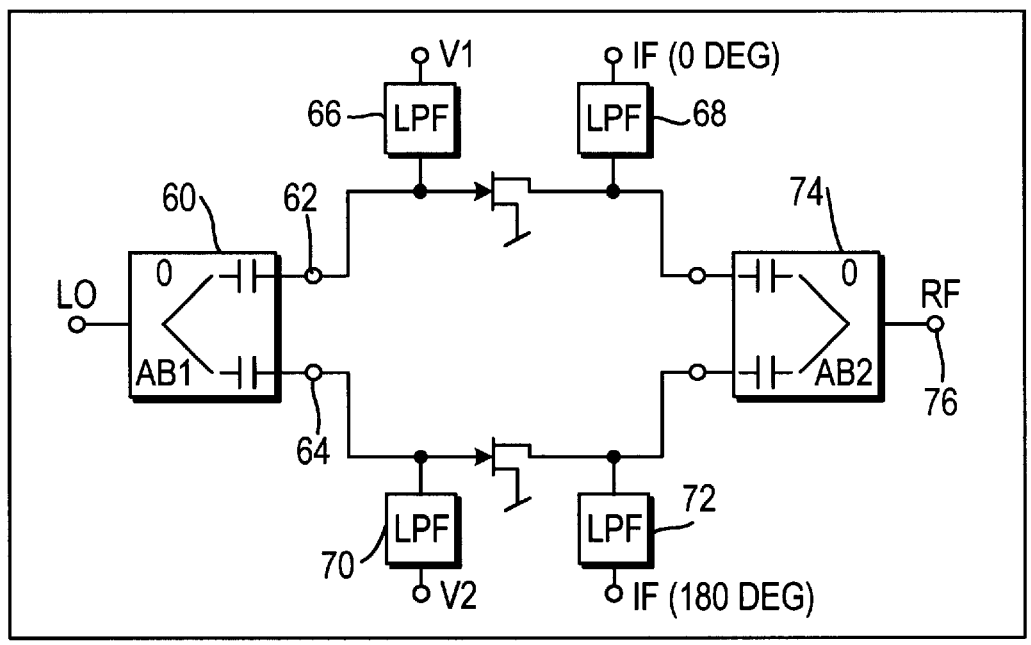
FIGS. 4a and 4b show a balanced transistor mixer according to the state of the art in a passive mode.
Figure 4B:
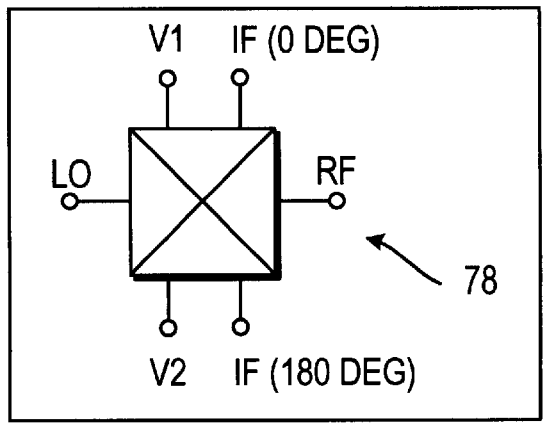

FIG. 4b shows in a simplified way inputs and outputs of a mixer 78 according to FIG. 4a.

The mixer which is shown in FIG. 4 is in passive mode. By arranging the transistors so that the outputs also receive fed regulating (supply) signals, i.e. four variable inputs are received per mixer, one has a mixer in active mode. IF is then supplied together with the control signal at the input of the transistor.

Passive mode transistor mixers are so far only tested out for MOSFET, MESFET and HEMT, the MESFET- and HEMT-versions are called "Resistive FET (HEMT) mixers". In order to describe the new method the starting point is taken in the mixer which is shown in FIG. 4 which is a resistive FET mixer which is known from the literature (Stephen A. Maas, "A GaAs MESFET Mixer with Very Low Intermodulation", 1987 IEEE MTT-S Digest, p 895–898).

Figure 5:
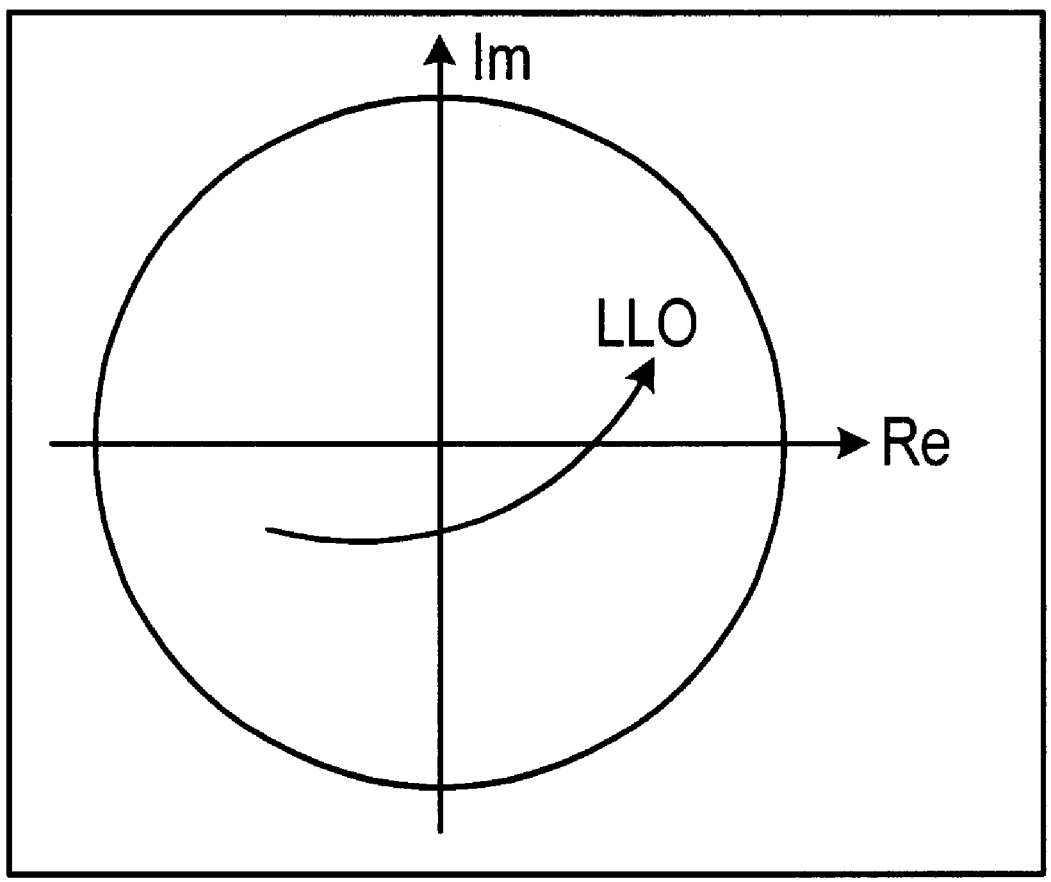
FIG. 5 shows how LLO deviates from the origin in a mixer according to FIG. 4 which is not ideal.

If this mixer had been ideal, for $V_1=V_2$ would LLO=0. This corresponds to the point of origin in the diagram in FIG. 5. FIG. 5 shows a coordinate system where the x-axis indicates the real value and the y-axis indicates the imaginary value of LLO. In practice this means that the distance from the origin determines the amplitude of LLO, while the direction from the origin determines the phase. Since the mixer is not ideal, it leaks a little and LLO is in a point a little outside the origin which depends upon the amplitude and the phase for LLO. If $V_1$ is varied up while $V_2$ is varied down (and vice-versa) LLO will travel in amplitude and phase as shown in FIG. 5.

Figure 6A:
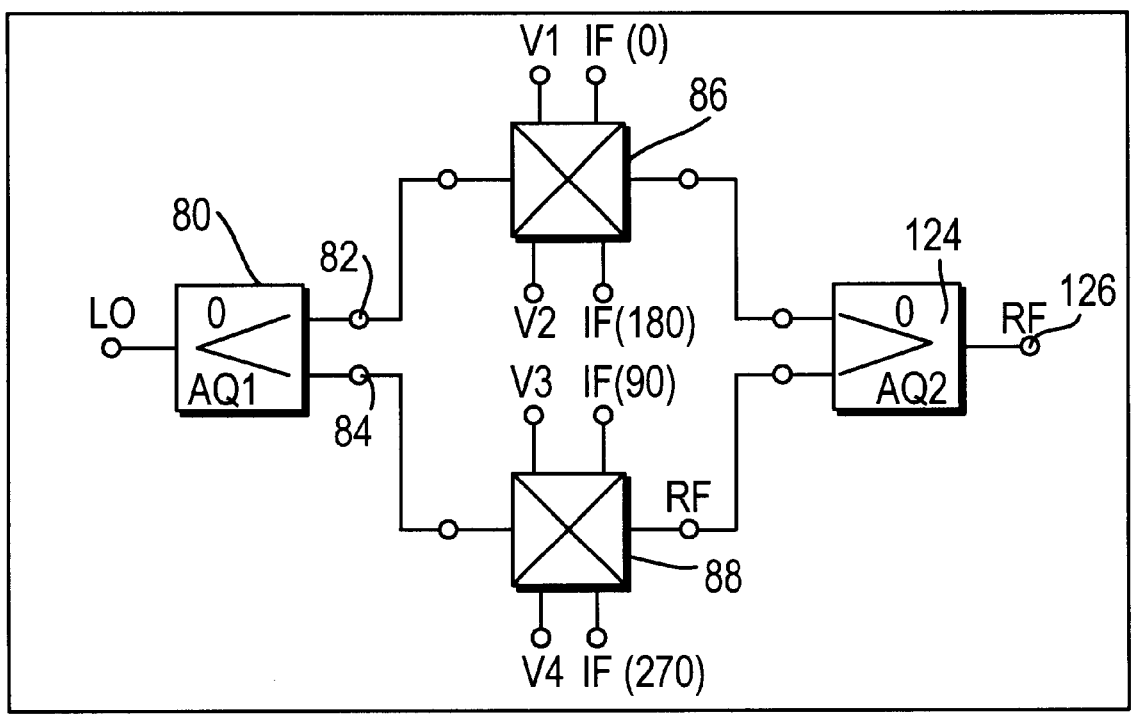
FIG. 6a shows with symbols an embodiment of a system according to the present invention where there are utilised two mixers in passive mode of the type as illustrated in FIG. 4 coupled together in an image reject coupling.
Figure 6B:
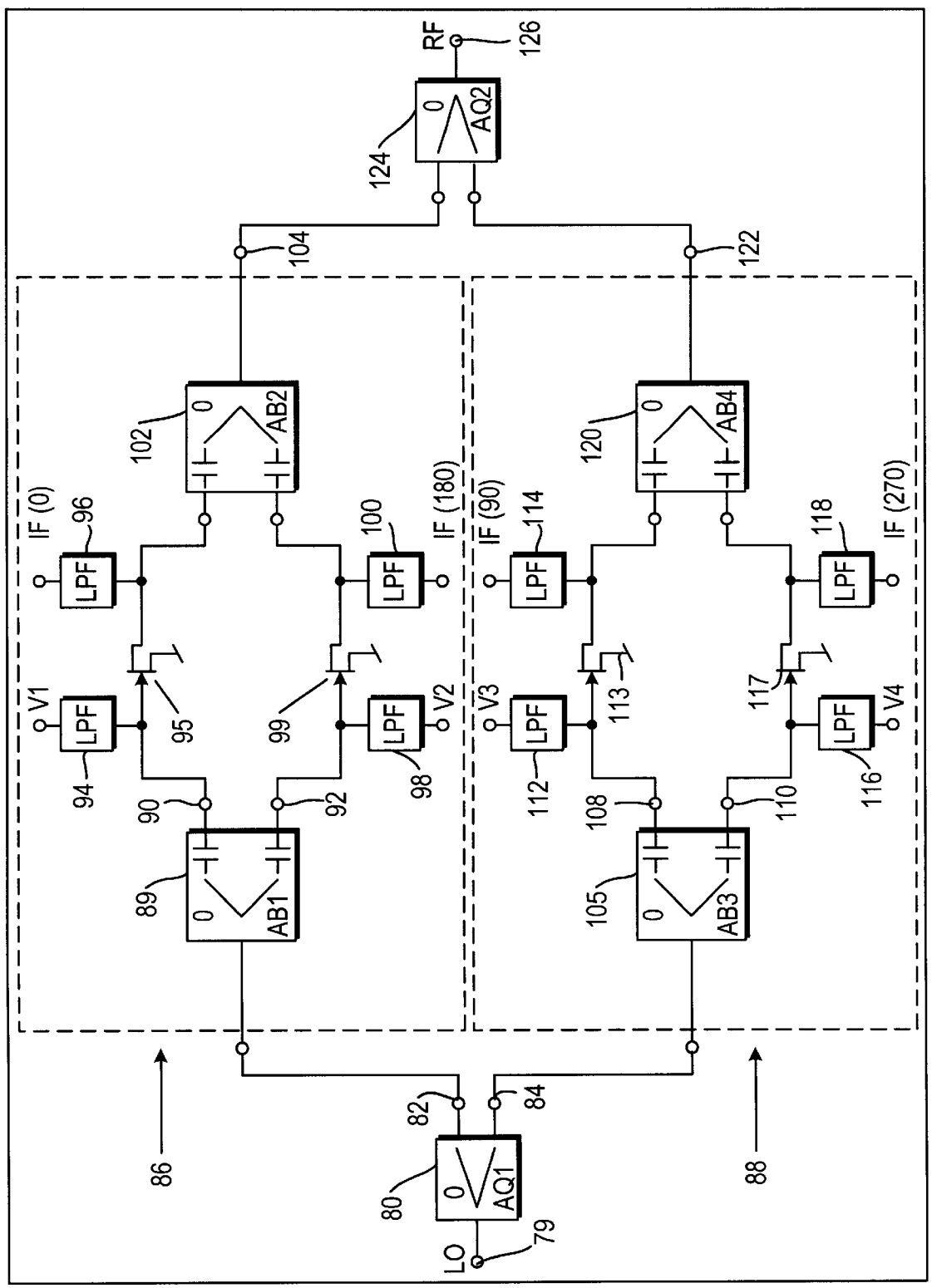
FIG. 6b shows a construction of a system according to the present invention where there are utilised two mixers in passive mode of the type as illustrated in FIG. 4 coupled together in an image reject coupling.

The present invention aims at mounting two mixers of the type shown in FIG. 4 in an image reject coupling. For the embodiments which are shown in FIG. 6a–6b the first signal is an LO-signal, the second signal an IF-signal and the third signal an RF-signal. 6a and 6b illustrate for passive mode transistors how the LO-signal is divided into two equal portions, i.e. $TLO_a$ and $TLO_b$ (not indicated in the Figures) and that these in the most preferred construction are phase-shifteed AQ1 (0 to 90 degrees) relative to each other in a coupler 80. $TLO_a$ and $TLO_b$ are led out through terminals 82 and 84, respectively, and each on its mixer, 86 and 88 respectively. The signal which is led out through terminal 82 is divided in coupler 89 in the mixer 86 additionally into two portions $TLO_{a1}$ and $TLO_{a2}$ which are phase-shifted AB1 (0 to 180 degrees) relative to each other, and the signals are led out through the terminals 90 and 92. The signal which comes from the terminal 90 is led through a transistor 95 so that $TLO_{a1}$ is voltage regulated ($V_1$) and mixed with IF (0 degrees), fed through the low pass filters 94 and 96, respectively, and the signal which comes from terminal 92 is led through a transistor 99 so that $TLO_{a2}$ is voltage regulated ($V_2$) and is mixed with IF (180 degrees) through the low pass filters 98 and 100, respectively. $V_1$ and $V_2$ can be varied. The signals are added again in the coupling 102 after they are phase-shifted AB2 (180 degrees–AB1) relative to each other, and are led out through the terminal 104.

Correspondingly the signal which is led out through terminal 84, and which is AQ1 (0 to 90 degrees) phase-shifted relative to the signal which passes through the terminal 82, will become divided in the coupling 106 into two portions (phase-shifted AB3—0 to 180 degrees—relative to each other), i.e. $TLO_{b1}$ and $TLO_{b2}$ which are led out through the terminals 108 and 110. $TLO_{b1}$ which comes from terminal 108 is led to a transistor 113 and is voltage regulated ($V_3$) and mixed with IF (90 degrees) supplied through the low pass filters 112 and 114, respectively, and $TLO_{b2}$ which comes from terminal 110 is led to a transistor 117 and is voltage regulated ($V_4$) and mixed with IF (270 degrees) supplied through the low pass filters 116 and 118, respectively. $V_3$ and $V_4$ can be varied. The signals are mixed again in the coupler 120 after they are phase-shifted AB4 (180 degrees–AB3) relative to each other, and are led out through the terminal 122.

The signals which come from the terminals 104 and 122, i.e. from the mixers 86 and 88, are added in the coupler 124 after they are phase-shifted AQ2 (most preferred to be 90 degrees–AQ1) relative to each other, and the sum signal or RF-signal is led out through the terminal 126.

Figure 6C:
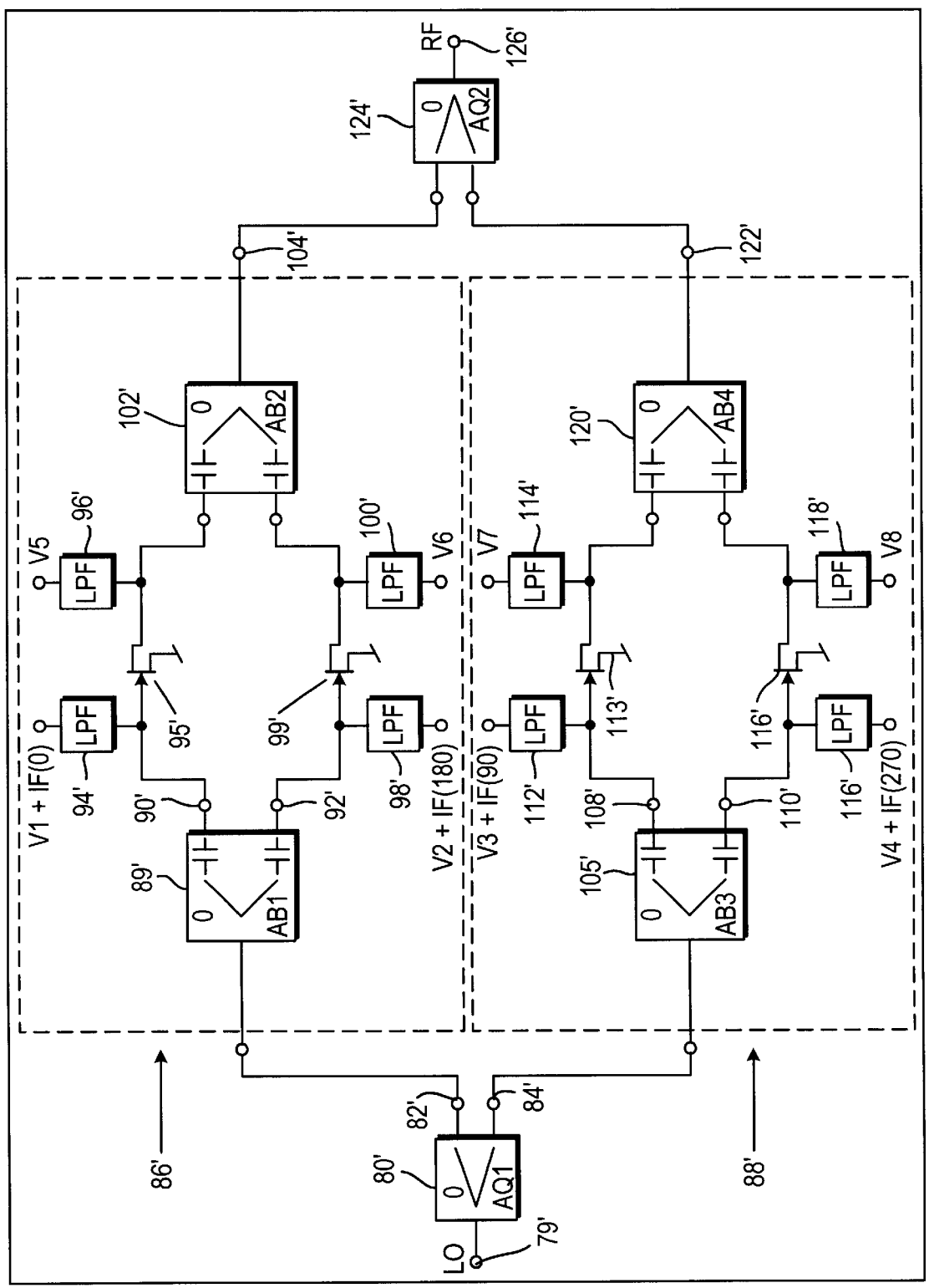
FIG. 6c shows a construction of a system according to the present invention where there are utilised two mixers in active mode coupled together in an image reject coupling.

FIG. 6c shows a system according to the invention where transistors in the active mode are utilised. The explanation is as for FIG. 6b with the difference that each transistor has two voltage regulating arrangements. The IF-signal is led in together with the one regulating arrangement. Totally there are then in the system 8 different regulators ($V_1$–$V_8$) which can be adjusted.

For the systems shown in the FIGS. 6a–c $V_1$ and $V_2$ cannot pass through the couplers 89, 89', 106, 106'. IF cannot pass through the couplers 102, 102', 120, 120'. For the passive mode it is further preferred that direct current cannot pass through the adding circuits 102,120, i.e. that the couplings 102,120 do not short circuit the outputs of the transistors 95,99 and 113,117. However the present invention also comprises systems where this is done. For the active mode the coupling must not short circuit the output of the transistors 95', 99' and 113', 117'.

The smart, novel and surprising with the system and the process according to the present invention is that IM is reduced because of the 90° phase-shift which takes place in the combination between the coupling 80 and 124, 80' and 124' respectively, and that simultaneously LLO is also reduced to approximately equal 0 (or the origin in FIG. 7) by correct adjustment of $V_1$–$V_4$ for the passive mode and $V_1$–$V_8$ for the active mode.

From transistors 95, 95' a portion of $LO_{a1}$ leaks through, $LLO_{a1}$, and from the transistors 99,99', 113, 113', 117, 117' respectively $LLO_{a2}$, $LLO_{b1}$, $LLO_{b2}$. $LLO_{a1}$ and $LLO_{a2}$ are added in couplings 102, 102', after having become phase-shifted AB2 degrees relative to each other. Since $TLO_{a1}$ is phase-shifted AB1 degrees relative to $TLO_{a2}$, $LLO_{a2}$ now becomes phase-shifted relative to $LLO_{a1}$ by AB1+AB2 degrees. This sum is preferred to be 180 degrees, since the leaked LO-signal viewed ideally thus phases itself out and is reduced to 0 (or the origin in FIG. 7). This does not occur in practice and one gets a leakage $LLO_a$ with a final amplitude and phase after couplings 102, 102' (see curve in FIG. 7). It is desired correspondingly to set AB3+AB4 close to 180 degrees and one gets a leakage $LLO_b$ (see curve in FIG. 7). By adjusting $V_1/V_2$ so that LLO for mixer 86,86' (LLO1) ends in A on the curve of FIG. 7 and $V_3/V_4$ so that LLO for mixer 88,88' (LLO2) ends in B on the other curve, the two leakage contributions from the two mixers (86 and 88 for the passive mode and 86' and 88' for the active mode) will phase each other out.

Relative to the known solutions the following advantages are obtained:

1. The method and the system is robust and ensures that LLO is sufficiently low if $V_1$, $V_2$, $V_3$, and $V_4$ (and $V_1$–$V_8$ for active mode) are adjusted to correct values.
2. The method and the system are not dependent upon a phase shifter. The same elements which remove IM also remove LLO.
3. More stable in temperature since the elements which determine phase and amplitude in the two mixers are like.

Further by utilising a transistor in the passive mode as mixing element the LLO will be already attenuated in each of the mixing elements on account of LO and RF being physically separated. The balancing contributes additional attenuation before the phasing out according to the present invention takes the major part of the remainder. The novel method with transistors in passive mode thus becomes much more robust than the phasing out method according to the prior art (Ishihara).

A passive transistor mixer is much more linear than a diode mixer. With the novel method a very linear mixer can thus be made with negligible LLO.

Further a diode is a component with two coupling points (terminals), while a transistor has three coupling points. With a diode all three main signals in the mixer—IF, LO, RF—will lie over the mixing element—the diode. With a transistor there is the possibility of physically separating LO and RF by coupling LO between node 1 and 3, while RF can be taken out between node 2 and 3 (not shown). IF can be coupled either together with LO or together with RF. This provides greater design freedom and is a clear advantage with thoughts of attenuating LLO (see above).

Ideally all LO shall be consumed in the mixing element. Then the mixer would act optimally and with LLO=0. Then a balanced configuration is not needed either. In practice not all LO is consumed—the diode reflects, the transistor both reflects and leaks/amplifies. That the leakage/amplification in the transistor can be varied without the conversion properties, that is to say loss/amplification and linearity, being changed appreciably is utilised in the present method.

With the method according to the present invention 4 regulating voltages (for passive mode) are necessary, against only two in the old. This can however easily be solved by setting $V_2$ and $V_4$ constant and so regulating with only $V_1$ and $V_3$. Alternatively a control circuit can be made which with one in-voltage adjusts two out-voltages—one voltage up and simultaneously the other voltage down. Two such circuits will limit the job of adjustment to only having to maintain 2 regulating voltages in the same way as in the two old methods.

Figure 6D:
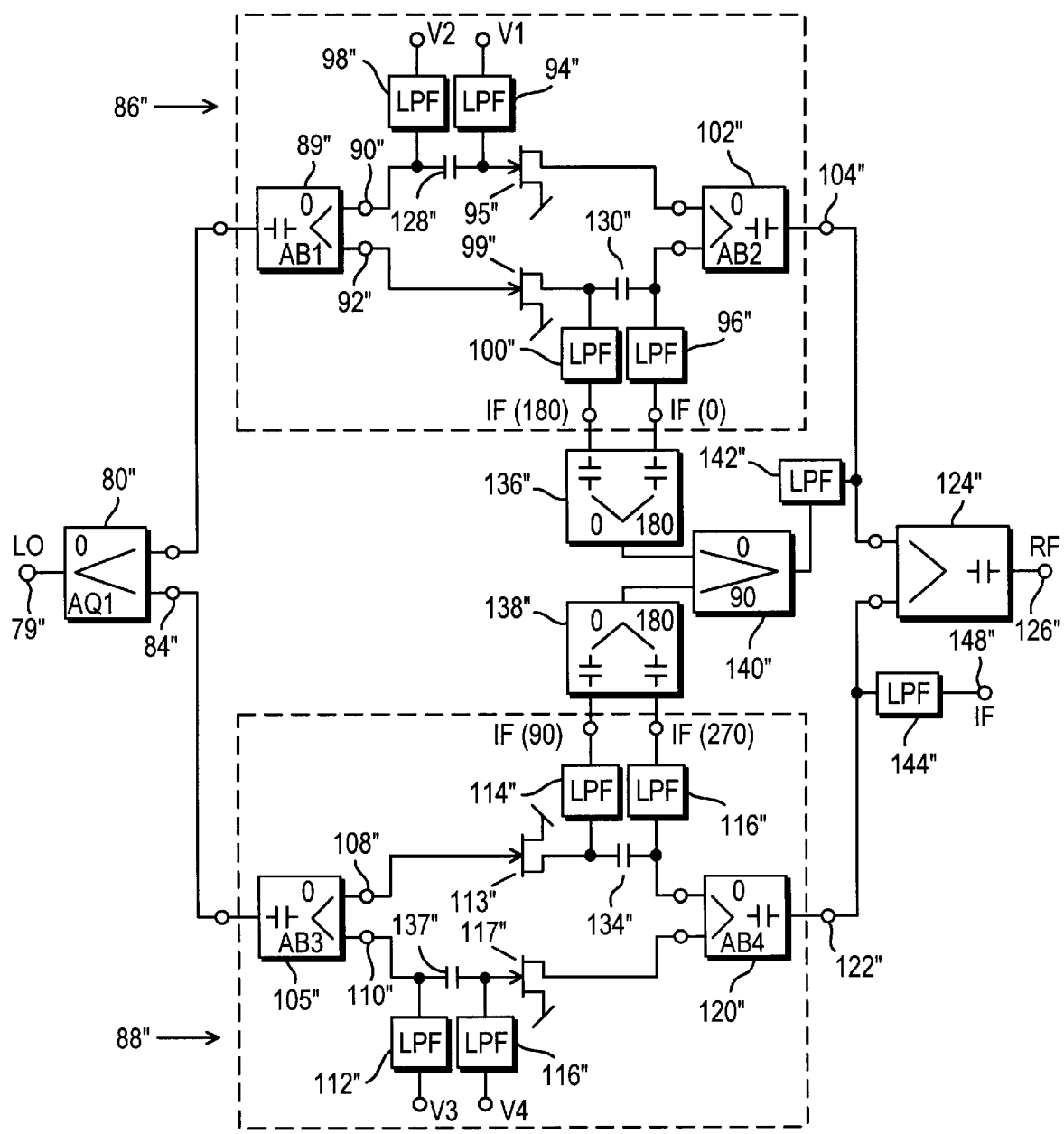
FIG. 6d shows a preferred construction of an LO-cancelling mixer without crossing IF-lines.
Figure 7:
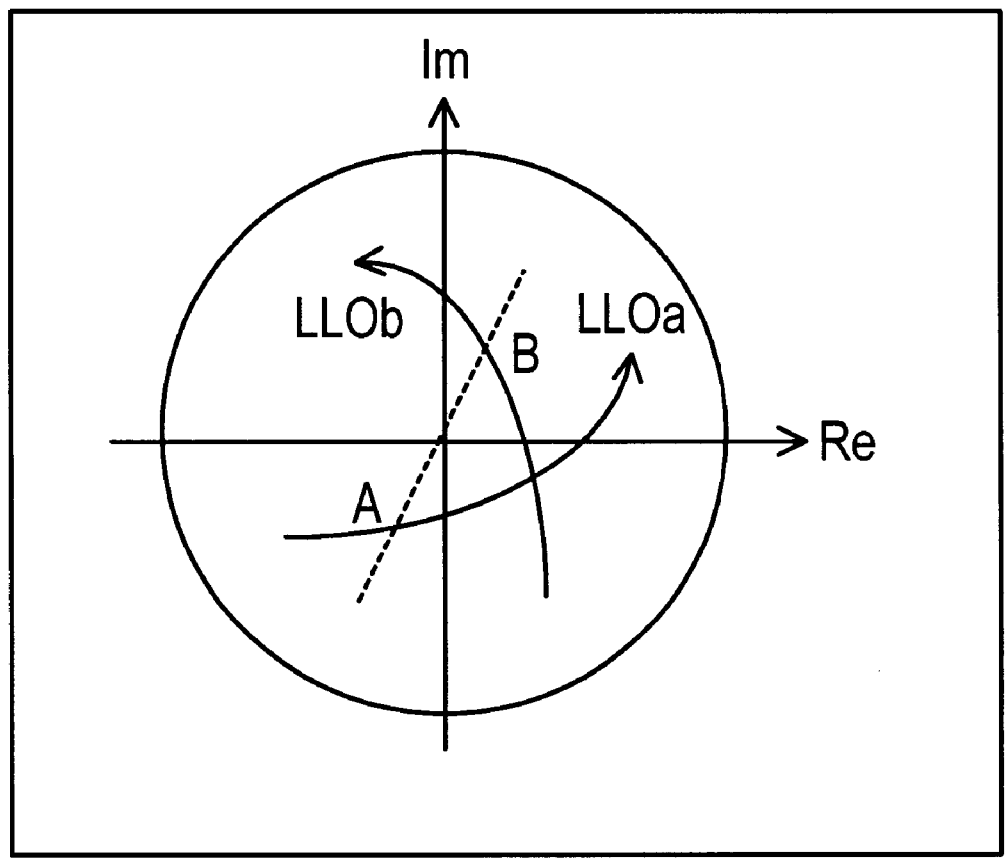
FIG. 7 shows how the two LLO contributions phase each other out, and that the sum of these is located in the origin.
Figure 8:
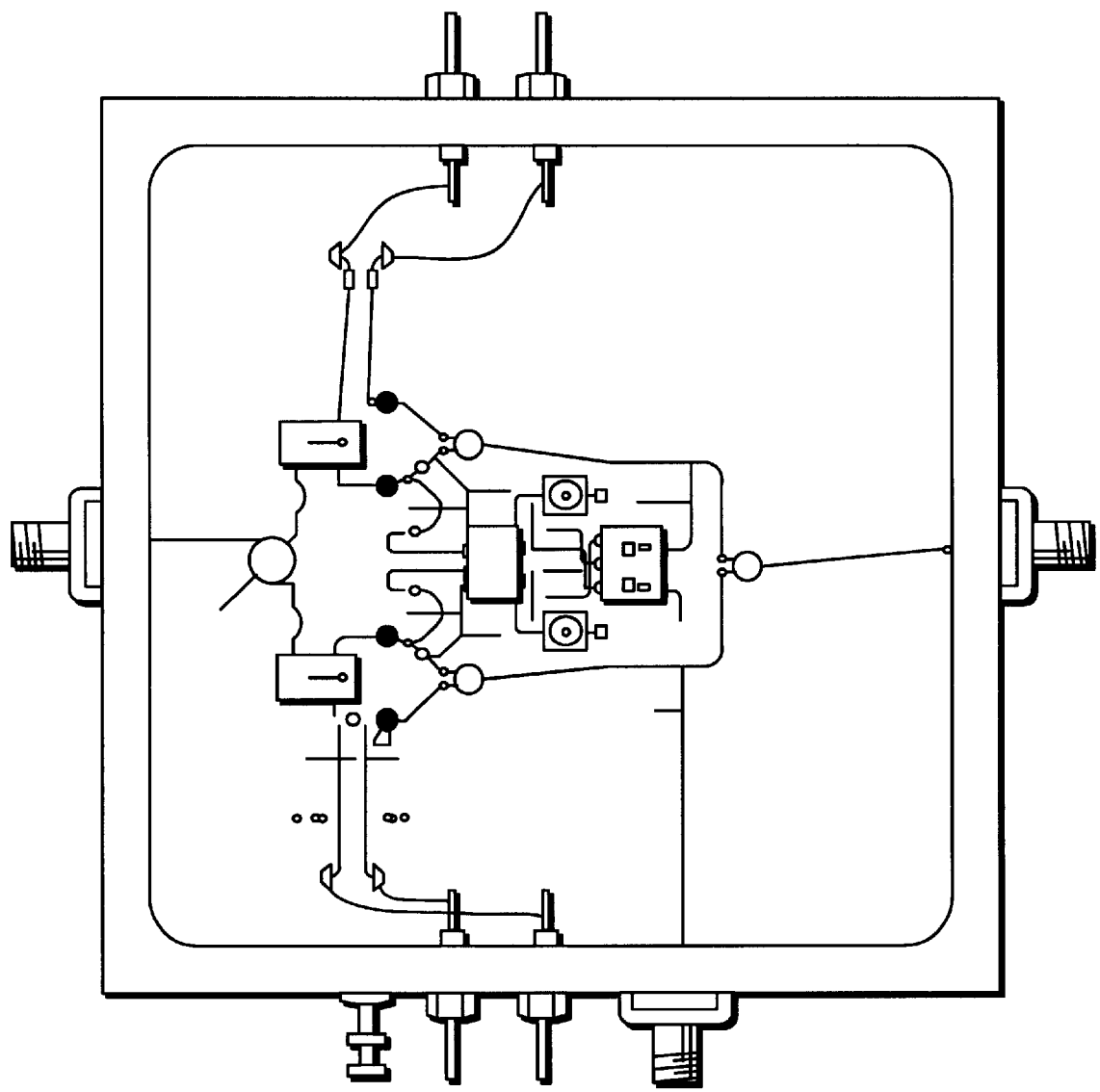
FIG. 8 shows a scanned picture of the mixer according to FIG. 6d.

Below a further preferred embodiment of the present invention is explained which is specifically developed for reducing the costs of production, avoiding undesired resonance effects, together with ensuring good balance in the mixer. This solution comprises a circuit solution which avoids crossing IF-lines, as shown in FIGS. 6*d* and 8. In the circuit solutions of FIG. 6*b* the couplers 89, 102, 106, 120 are provided with blocks for regulating voltages and IF signals. These blocks are usually realised with so-called decoupling capacitors and are arranged in order to prevent the signals from flowing between the terminals of the couplers and thus leaking away or short-circuiting each other. In the circuit solution of FIG. 6*d* some of these capacitors are moved in order to achieve the aforementioned advantages. In the two balanced mixers one of the decoupling capacitors in front of the gates is moved to the input of the couplers. The other is moved out as is shown explicitly on the one transistor branch (128", 130", 132", 134"). Thus the connections for the two regulating voltages which are on the inside of the structure ($V_2$ and $V_3$) are moved to the outside and the connections for the two IF signals which are on the outside of the structure (IF(0), IF(270)) are moved to the inside. The Wilkerson hybrid (102" and 120") which couple together the two branches, does not isolate on such a low frequency as the IF-frequency. Thus the IF-signals will each reach their respective transistor without losing the balance in level. The desired phase difference between the four IF-signals is maintained by taking care that physical distances for the signals are equal. This is not shown in FIG. 6*d*, but emerges in the realised circuit shown in FIG. 8. In FIG. 6*b* the IF structure with 180 and 90 degrees couplings is not shown. In the solution of FIG. 6*d* this is included in order to show clearly a complete realisation.

FIG. 6*d* thus shows a system where transistors are utilised in the passive mode. The explanation of the Figure is as for FIG. 6*b*, but with the difference and clear advantage that connections for regulating voltages and IF are on the outside of the circuit and no lines cross each other as they are obliged to do in the solution of FIG. 6*b* when the IF structure is included. The LO-signal is divided into two equal portions in a coupler 80" which are phase-shifted AQ1 relative to each other. The one portion of the signal is further divided into two signals via coupling 89", mutually phase-shifted AB1 degrees, before the two signals are led out through the terminals 90" and 92". The decoupling capacitor 128" separates the two connections of the regulating voltages $V_1$ and $V_2$, which now have entered the same transistor branch. This creates an imbalance for the LO-signal before the transistors. After the transistors the decoupling capacitor 130" separates the connections for the two IF-signals which now are arranged on the same transistor branch—the opposite. Thus the balance is restored for the LO-signal which leaks through the two transistor branches.

Correspondingly for the portion of the signal which is led from coupling 80" via terminal 84" to coupling 110" where the signal further is divided into two portions, mutually phase-shifted AB3 degrees, before the two signals are led through the terminals 108" and 106". The decoupling capacitor 132" separates the two connections for the regulating voltages $V_3$ and $V_4$, which are no arranged on the same transistor branch. After the transistors the decoupling capacitor 134" separates the connections for the two IF-signals which now are arranged on the same transistor branch—the opposite. Thus also here the balance is restored for the LO-signal which leaks through the two transistor branches.

Now when all the IF-signals are met on the inside of the mixer structure the IF structure can be arranged there. This is done with two 180 degrees couplers (136" and 138") and a 90 degrees coupler (140"). It is preferred that direct current shall not be able to pass through the 180 degrees couplers, and there is therefore shown an decoupling arrangement at 136" and 138". These decoupling arrangements must not impede the IF-signal. In order to get the IF-signal in to the IF structure two low pass filters (142" and 144") are employed together with the fact that the Wilkerson coupler (124") does not isolate at the IF-frequency. The result is that the balance is also maintained in the image reject coupling. The IF-signal is thus fed at terminal 146", is fed to the RF-line via filter 144", is led unimpeded through coupling 124" to filter 142" where it is led to coupling 140", is split in 0 and 90 degrees, is led further to coupling 136" and 138" where the signals are split to IF(0), IF(180), IF(90) and IF(270). It clearly emerges from FIG. 6d that no crossings are necessary.

FIG. 8 shows a picture of a realised version of the mixer of FIG. 6d. Here one has chosen to set AQ1=90 degrees and thus AQ2=0 degrees. The coupler 80" could thus be realised as a branch coupler and the coupler 124" as a Wilkerson coupler. Further one has chosen to set AB1=AB3=180 degrees and thus AB2=AB4=0 degrees. The couplers 89" and 106" could thus be realised as "rat-rach" hybrids, while the couplers 102" and 120" were realised as Wilkerson couplers. None of these couplers has any insulation for control voltages and IF-signals. The decoupling arrangements internally in the couplers are realised as small decoupling capacitors for 89" and 106", while for the couplers 102", 120" and 124" physically larger coupled filters are employed. The coupled filters give better insulation from the IF-signal and at the outlet their physically larger dimensions can also be utilised for naturally displacing the IF-connections further out. Various undesired reflections in the IF-structure can then be avoided. Couplers in the IF structure are diversely packed circuit elements. In order to avoid direct current signals, produced in the transistors 95", 99", 113" and 117" from short-circuiting through the IF-structure, the decoupling arrangement in 126 and 138" (see FIG. 6d) have been employed. These do not impede the IF-signal. In FIG. 8 these are realised as decoupling capacitors. A variable resistance has also been employed plus two variable condensers so as be able to tune phase-difference and amplitude balance in the four internal IF connections. This makes possible an adjustment of undesired IM attenuation.

Figure 9:
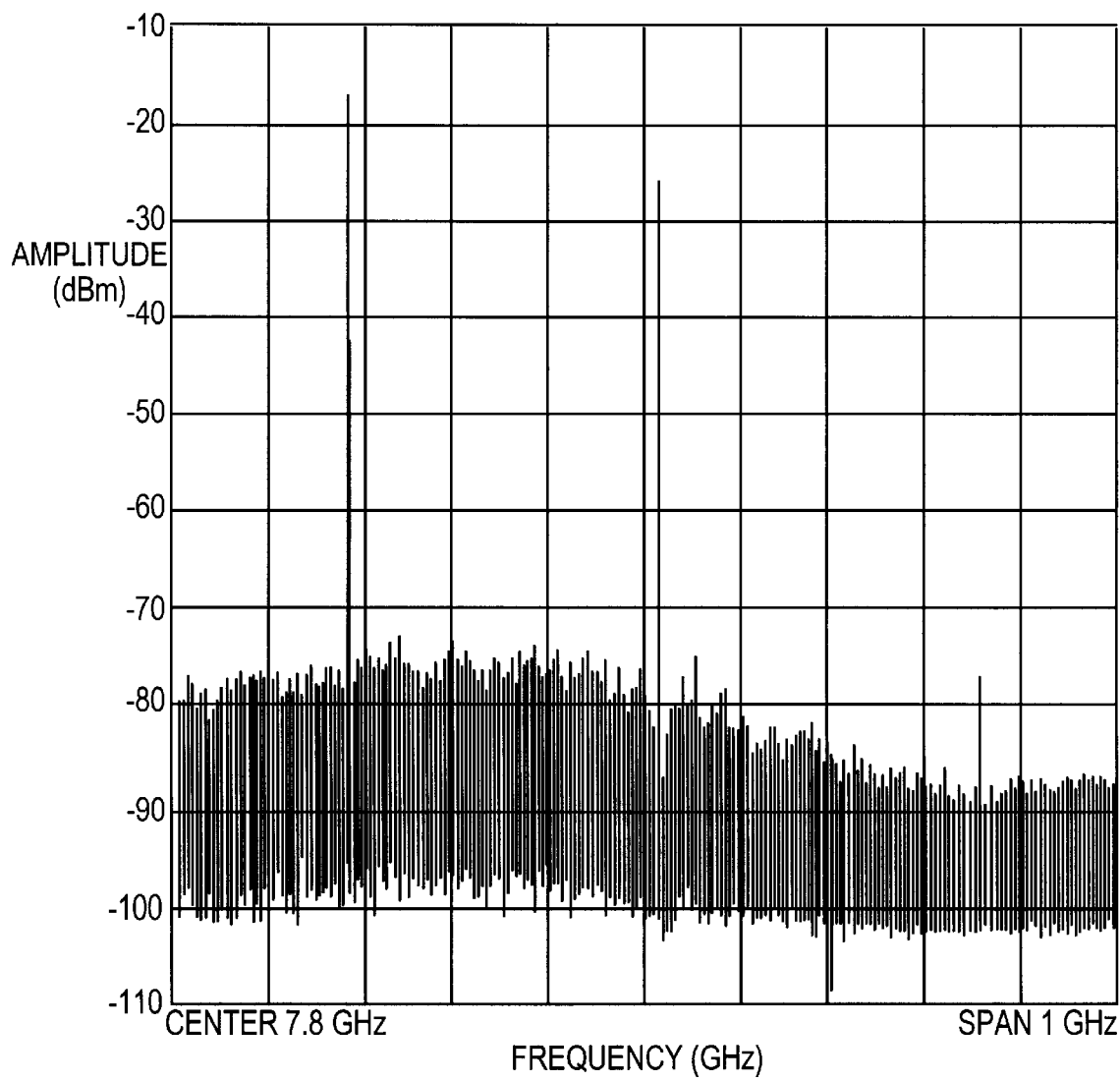
FIG. 9 shows measured values for a mixer with equal gate voltages.
Figure 10:
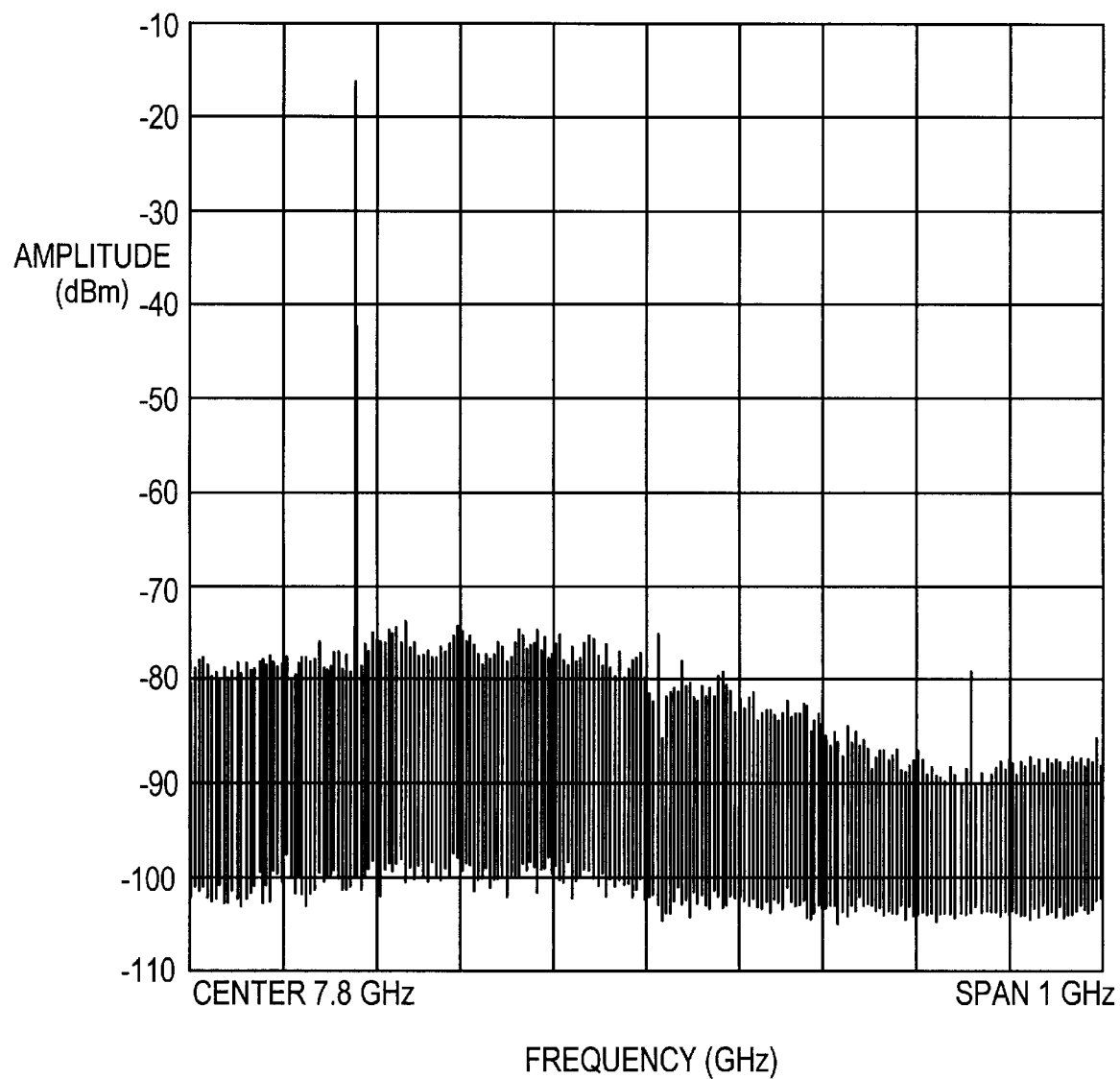
FIG. 10 shows measured values for the same mixer as in FIG. 9, but where the gate voltages are adjusted in order to cancelling the LO-leakage.

It is evident from FIGS. 9 and 10 how the LO-leakage can be reduced by adjusting the regulating voltages V1, V2, V3 and V4. In the two graphs the RF-signal is the left top, the LO-leakage is the most central top and the top to the right shows the undesired IM-signal. It is clearly evident that by adjusting the regulating voltages a significant profit is achieved with respect to reduced LO-leakage.

The solution of FIGs. 6b and 6d can be compared with corresponding diode mixer solutions. In M. J. Schindler et al: "A Comparison of GaAs Transistors as Passive Mode Mixers" it is evident that diode mixers typically have OIP3 ("output third order intercept point"—defines how linear they are) of −6 dB to −3 dB relative to the LO-power. The solution according to the present invention has however an OIP3 of over +3 dB relative to the LO-power. It implies that IMD3 (output third order intermodulation) is improved more than 12 dB. This means that one gets an equally clean signal from this novel solution even if it is 16 times stronger than for a corresponding diode mixer solution.

What is claimed is:

1. A process for reducing leakage of LO in a non-ideal system which converts the frequency of a first signal by mixing the first signal with a second supplied signal to a third signal of a frequency which is different from the frequency for the first and second signal, wherein the first signal is divided via a plurality of couplers into a plurality of part-signals which are phase-shifted relative to each other, and that each such part-signal is led through its respective transistor there being added via each transistor a second signal which is mixed with the first signal, and that the signals which pass through the transistors are modulated with a plurality of voltage regulating means for each transistor and that the frequency-shifted part-signals are added to a third signal via a number of couplers, after the signals are phase-shifted relative to each other, the voltage regulating means being adjusted to modulate the signals so that LLO is reduced and wherein the LO-signal which is supplied the system through a terminal is divided in the coupler into two portions $TLO_a$ and $TLO_b$, which are phase-shifted relative to each other, each of these part-signals being further divided into two portions which are phase-shifted relative to each other, such that $TLO_a$ is divided in the coupler to $TLO_{a1}$ and $TLO_{a2}$, and $TLO_b$ is divided in the coupler to $TLO_{b1}$ and $TLO_{b2}$, each of the four signals being led through its respective transistor in passive mode or active mode so that $TLO_{a1}$ is voltage regulated and is mixed with $IF_{a1}$ and forms $RF_{a1}$ with the leakage $LLO_{a1}$, $TLO_{a2}$ is voltage regulated and is mixed with $IF_{a2}$ and forms $RF_{a2}$ with the leakage $LLO_{a2}$, $TLO_{b1}$ is voltage regulated and is mixed with $IF_{b1}$ and forms forms $RF_{b1}$ with the leakage $LLO_{b1}$, $TLO_{b2}$ is voltage regulated and is mixed with $IF_{b2}$ and forms $RF_{b2}$ with the leakage $LLO_{b2}$, and that $RF_{a1}/LLO_{a1}$ and $RF_{a2}/LLO_{a2}$ are added in the coupler to $RF_a/LLO_a$, and that $RF_{b1}/LLO_{b1}$ and $RF_{b2}/LLO_{b2}$ are added in the coupler to $RF_b/LLO_b$, and that $RF_a/LLO_a$ and $RF_b/LLO_b$ are added in the coupler to an RF-signal/LLO which leaves the system through a terminal.

2. The process of claim 1, wherein AQ1+AQ2 is in the region of 75–105°

3. The process of claim 1, wherein AB1+AB2, and AB3+AB4 are in the region of 160–200°.

4. The process of claim 1, wherein AQ1+AQ2 is about 90°, and that AB1+AB2 and AB3+AB4 are about 180°.

5. The process of claim 1, wherein the regulating means are adjusted so that LLO from the first mixer phases out LLO from the second mixer.

6. The process of claim 1, wherein the regulating means are adjusted so that LLO from the first mixer phases out LLO from the second mixer.

7. The process of claim 1, wherein the first signal is an LO-signal, the second signal is an IF-signal and the third signal is an RF-signal.

8. The process of claim 1, wherein the first signal is an LO-signal, the second signal is an RF-signal and the third signal is an IF-signal.

9. The process of claim 1, wherein the IF-lines are arranged so that none of these crosses, the voltage regulators and mixer being arranged on the same branch only separated by a decoupling an arrangement, and correspondingly that the voltage regulators and for mixer are arranged on the same branch only separated by a decoupling arrangement, and where the imbalance which occurs, for the LO-signal before the transistors, is removed by there being arranged a decoupling arrangement which separates the two IF-signals.

10. The process of claim 9, wherein an extra length is installed in the one IF-connection this maintaining the phase difference of 180° between the two IF-signals by compensating for differences in length of the two branches.

11. The system of claim 10, wherein each transistor comprises a regulating means.

12. The system of claim 10, wherein each transistor comprises two regulating means.

13. The system of claim 10, wherein the first signal is an LO-signal, the second signal is an IF-signal and the third signal is an RF-signal.

14. The system of claim 10, wherein the first signal is an LO-signal, the second signal is an RF-signal and the third signal is an IF-signal.

15. The system of claim 10, wherein the IF-lines are arranged so that these do not cross each other, the voltage regulators and mixer being arranged on the same branch only separated by a decoupling arrangement, and correspondingly that the voltage regulators and for mixer are arranged on the same branch only separated by a decoupling arrangement, and where the imbalance which occurs, for the LO-signal before the transistors, is removed by arranging a decoupling means which separates the two IF-signals.

16. The system of claim 15, wherein an extra length is installed in the one IF-connection, this maintaining the phase difference of 180° between the two IF-signals, by compensating for differences in length of the two branches.

* * * * *